United States Patent
Lin

(10) Patent No.: US 10,283,209 B2
(45) Date of Patent: May 7, 2019

(54) METHOD FOR DETECTING PROBLEM CELLS OF SATA SSD AND SATA SSD HAVING SELF-DETECTING FUNCTION LOOKING FOR PROBLEM CELLS

(71) Applicant: Storart Technology Co., Ltd., Hsinchu (TW)

(72) Inventor: Chun Hsien Lin, Hsinchu (TW)

(73) Assignee: Storart Technology (Shenzhen) Co. Ltd, Shenzhen (CN)

( * ) Notice: Subject to any disclaimer, the term of this patent is extended or adjusted under 35 U.S.C. 154(b) by 21 days.

(21) Appl. No.: 14/847,197

(22) Filed: Sep. 8, 2015

(65) Prior Publication Data
US 2017/0068487 A1     Mar. 9, 2017

(51) Int. Cl.
| | | |
|---|---|---|
| *G11C 29/44* | (2006.01) | |
| *G11C 29/04* | (2006.01) | |
| *G11C 16/34* | (2006.01) | |
| *G11C 29/50* | (2006.01) | |

(52) U.S. Cl.
CPC ........ *G11C 16/349* (2013.01); *G11C 29/4401* (2013.01); *G11C 29/50004* (2013.01); *G11C 2029/0409* (2013.01); *G11C 2029/4402* (2013.01)

(58) Field of Classification Search
None
See application file for complete search history.

(56) References Cited

U.S. PATENT DOCUMENTS

| | | | | |
|---|---|---|---|---|
| 2003/0161199 A1* | 8/2003 | Estakhri | ............... | G11C 16/349 365/200 |
| 2009/0217111 A1* | 8/2009 | Ito | ................... | G01R 31/31724 714/718 |
| 2010/0290149 A1* | 11/2010 | Ahmad | ............... | G11B 19/043 360/71 |
| 2010/0293309 A1* | 11/2010 | Lin | .................... | G06F 13/4081 710/66 |

(Continued)

FOREIGN PATENT DOCUMENTS

TW     201330234     7/2013

OTHER PUBLICATIONS

Wikipedia page for Serial ATA labelled as "A044 NPL Wikipedia Serial ATA" (Year: 2018).*

*Primary Examiner* — Edward J Dudek, Jr.
*Assistant Examiner* — Andrew Russell
(74) *Attorney, Agent, or Firm* — Che-Yang Chen; Law Offices of Scott Warmuth

(57) ABSTRACT

A method for detecting problem cells of a SATA SSD and a SATA SSD having self-detecting function looking for problem cells are disclosed. The method includes the steps of: providing a detecting program used to detect aged and died cells in a SATA SSD; writing the detecting program to a MCU (Micro Control Unit) in the SATA SSD; pulling high electric potential of a communicating pin of a SATA connector of the SATA SSD to initiate the detecting program; collecting location data of aged and died cells in the SATA SSD by the detecting program; and storing the location data in a storage area in the SSD. The present invention utilizes the DAS/DSS pin as a channel to initiate detecting program. It has advantages of using current interface of SSD, no effort on taking apart hardware and automatically running the detecting program without human control.

11 Claims, 3 Drawing Sheets

(56) References Cited

U.S. PATENT DOCUMENTS

| | | | |
|---|---|---|---|
| 2012/0191996 A1* | 7/2012 | Cheong | G06F 1/3256 713/320 |
| 2013/0124932 A1* | 5/2013 | Schuh | G06F 9/44 714/718 |
| 2013/0159785 A1* | 6/2013 | Hashimoto | G06F 11/004 714/47.2 |
| 2013/0159814 A1* | 6/2013 | Hashimoto | G11C 29/04 714/773 |
| 2013/0311683 A1* | 11/2013 | Mundt | G06F 11/0775 710/18 |
| 2014/0172325 A1* | 6/2014 | Naji | G06F 11/008 702/34 |
| 2014/0281154 A1* | 9/2014 | Hashimoto | G11C 29/1201 711/103 |
| 2014/0289559 A1* | 9/2014 | Hashimoto | G11C 29/08 714/27 |

* cited by examiner

METHOD FOR DETECTING PROBLEM CELLS OF SATA SSD AND SATA SSD HAVING SELF-DETECTING FUNCTION LOOKING FOR PROBLEM CELLS

FIELD OF THE INVENTION

The present invention relates to a method for detecting status of a SATA (Serial Advanced Technology Attachment) SSD (Solid State Drive) and a SATA SSD having a function implemented by the method. More particularly, the present invention relates to a method for detecting problem cells of a SATA SSD and a SATA SSD having a self-detecting function implemented by the method to look for problem cells. The problem cells may be dead or have a potential of fast aging.

BACKGROUND OF THE INVENTION

Flash memory is a technology of memory achieved by a number of silicon transistors. Electronics are held in floating gates so that permanent information can be kept. Flash memory is in the form of an EEPRON (Electrically-Erasable Programmable Read-Only Memory). However, it is allowed to be erased or written many times for operation. Therefore, flash memory is widely used to store data, further for transmitting the data between computers and other digital products. A main application is a memory card and a pen drive. As capacity of one flash memory chip increases significantly nowadays, a set of flash memory chips may provide storage capacity as a traditional hard disk does. Besides, flash memory has an advantage that it is not affected or damaged from shaking when it works. Therefore, SSDs (Solid State Drives) comprising of a number of flash memory chips are becoming very popular in the storage market, used in the computers and portable storages. SSD occupies a large amount market share which comes from hard disks.

A flash memory includes many storing units (cells). One type of flash memory that each cell inside was only able to save one bit message is called SLC (Single-Level Cell) flash memory. Advantages of the SLC flash memory are fast read-write speed, less power consumption and long lifetime. Relatively, comparing with other types of flash memories, a shortcoming of the SLC flash memory is its high manufacturing cost. Another type of flash memory is MLC (Multi-Level Cell) flash memory. Each of its cells has four potential states (multi-level voltage). Thus, it can store more bits in one cell. The MLC flash memory has lower read-write speed than the SLC flash memory. Life time is only one tenth of the SLC flash memory. Power consumption is high. However, for the same storage capacity, cost of the MLC flash memory is only a quarter of that of the SLC flash memory. As portable electronic devices have larger storage space than every while prices thereof drop very fast, MLC flash memory becomes the main stream for these devices, even for some notebooks.

In the past few years, a new generation of flash memory comes out. It is TLC (Triple-Level Cell) flash memory. Architecture of the TLC flash memory is similar to that of the MLC flash memory. However, each cell of the MLC flash memory can store data of 3 bits. Of course, read-write speed of the TLC flash memory compared with other types is lower. Lifetime is generally below 1000 times. But, cost of the TLC flash memory is very friendly to commodities, such as tablets or entry level smart phones. With wear leveling technology, lifetime of storages composed of TLC flash memory chips can effectively extend. Basically, for a consumer electronics product, it may have storage space large enough so that users would not fully utilize it (cells fail or get aged) before the product dies out. TLC flash memory has such niche to grow in the market.

Although the TLC flash memories have benefits of low cost, they are facing a challenge. When the TLC flash memories work or be processed, e.g. under wave soldering, at a high temperature (above 60° C.), the cells may lose their ability to keep current electric potential. 0 or 1 in one cell cannot be differentiated and data stored in a block becomes wrong. Some cells may be aged or even dead. Despite of it, some failed cells do exist before the TLC flash memory cells are assembled in a device for sale. There are also some cells getting aged fast than others. If such problem cells are not found and isolated for use before the device is sold out, customer complains will be a headache for the manufacturer. Sometimes, the problem would happen in the MLC flash memories.

If the flash memory chips have been processed to form a SSD, the problem mentioned above becomes complicated to settle. Although the flash memory chips passed QC (quality control) tests before they were sold to the SSD manufacturer, they might get damaged or aged when wave soldering was processed. Finally, the SSD would be packed in a housing to be a finished product. It is not workable for a final QC process to take apart the housing for all SSDs just to test dead and problem cells in the flash memory chips. There are still some issued SSDs left even sampled SSDs are inspected to ensure quality of a batch of SSDs.

Reviewing the prior arts, there are some techniques which may provide a solution to the quality problem. For example, U.S. Pat. No. 8,667,345 provides a burn-in method for embedded multi-media cards and a testing board. The method of '345 is writing a test pattern to a flash memory of one embedded multi-media card first. Then, electrically connect a command line of the embedded multi-media card to ground to operate the embedded multi-media card in a boot state. Afterwards, perform a burn-in procedure on the flash memory when the embedded multi-media card is in the boot state and the test pattern is recognized as being contained in the flash memory. Finally, collect a test report during the burn-in procedure and storing the test report in the flash memory. The test report may include locations of aged and dead cells. Thus, a page or a block containing the cells will be dropped and not used. '345 indicate an innovative way to test flash memory utilizing existing line in the embedded multi-media card. However, for a SSD, it is not workable due to different architecture.

Another invention for reference is disclosed by U.S. Pat. No. 7,512,847. '847 provides a method for estimating and reporting the life expectancy of flash-disk memory. The method has two main steps: (a) monitoring a value of a longevity parameter of a memory device after a programming operation on the memory device, the monitoring being performed by the memory device; and (b) deriving a grade of the memory device from the value. The value is a number of programming pulses associated with the operation, required to change logic states of at least one cell in a page of the memory device. Although '847 discloses a good method to monitor the status of flash memories and can be applied to SSD. However, for the final QA for the SSDs, the method is not able to automatically run without dismantle housings or utilizing external control from a computer.

There is no suitable solution available. Therefore, the present invention provides a method for detecting aged and dead cells of SSDs through an SATA interface and a SSD having self-detecting function to look for problem cells by using the method to settle the aforementioned problem.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the problems mentioned above, an aspect of the present invention is to provide a method for detecting problem cells of a SATA SSD. The method includes the steps of: A. providing a detecting program used to detect aged and dead cells in a SATA SSD; B. writing the detecting program to a MCU (Micro Control Unit) in the SATA SSD; C. pulling high electric potential of a communicating pin of a SATA connector of the SATA SSD to initiate the detecting program; D. collecting location data of aged and dead cells in the SATA SSD by the detecting program; and E. storing the location data in a storage area in the SSD.

According to the present invention, the method further includes the step E1 after the step E: E1. outputting the location data through the communicating pin in a form of electric potential change externally. The method can further include the step E2 after the step E: E2. outputting the location data through a LED (Light Emitting Diode) of the SATA SSD in a sequence of on and off. The method can also include the step E3 after the step E: E3. isolating the aged and dead cells not for accessing by the MCU. Preferably, the step B1 is after the step B: B1. heating up the SATA SSD.

Preferably, the communicating pin is DAS/DSS (Device Activity Signal/Disable Staggered Spin-up) pin. The location data comprises physical locations of the aged or dead cells, detecting time, aged or dead status of the cell, or a combination thereof. The cells that store the location data area are not dead or aged.

The present invention further discloses a SATA SSD which has a self-detecting function looking for problem cells. The SATA SSD includes: a number of flash memory chips, for storing data and being accessed; a SATA connector, having a communicating pin; and a MCU, electrically connected with the flash memory chips and the SATA connector, for operating the SATA SSD and accessing the flash memory chips, having a memory unit; wherein a detecting program is written into the memory unit; the detecting program is initiated by pulling high electric potential of the communicating pin; the detecting program runs to detect aged and dead cells in the SATA SSD, collect location data of aged and dead cells in the SATA SSD, and store location data of the aged and dead cells in a storage area in the SATA SSD.

Preferably, the MCU further outputs the location data through the communicating pin externally in a form of electric potential change. A LED is electrically connected with the MCU. The MCU further outputs the location data through the LED in a sequence of on and off. The detecting program isolates the aged and dead cells so that they are not accessed by the MCU.

The present invention utilizes the DAS/DSS pin as a channel to initiate detecting program. It has advantages of using current interface of SSD, no effort on taking apart hardware and automatically running the detecting program without human control.

DETAILED DESCRIPTION OF THE PREFERRED EMBODIMENT

The present invention will now be described more specifically with reference to the following embodiment.

Figure 1:
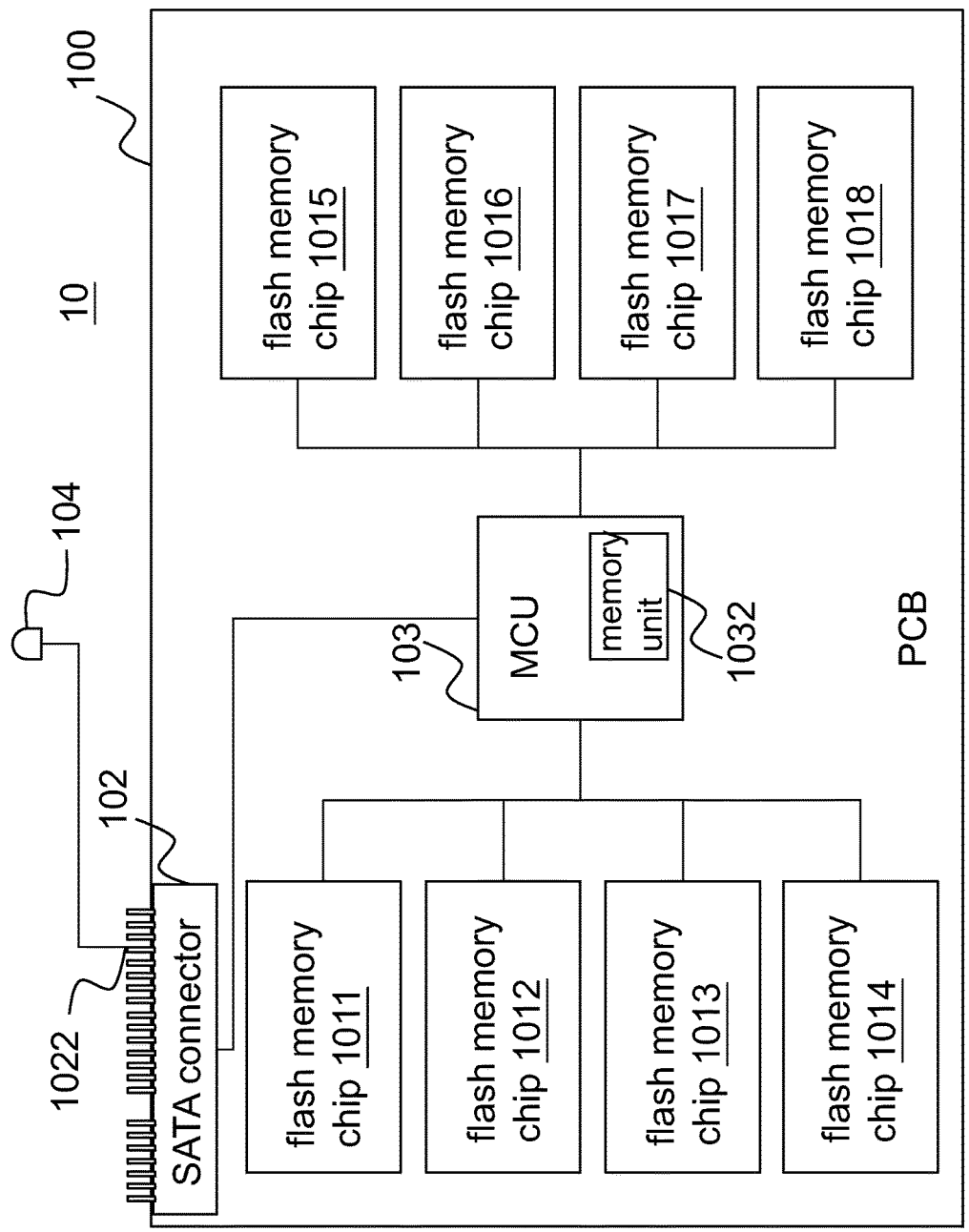
FIG. 1 is a schematic diagram of an SATA SSD having a self-detecting function looking for problem cells according to the present invention.

Please refer to FIG. 1. An embodiment of an SATA SSD 10 which has a self-detecting function looking for problem cells according to the present invention is disclosed. FIG. 1 is a schematic diagram of the SATA SSD 10. There may be a housing (not shown) to protect the SATA SSD 10. However, it is not the key point of the present invention and not illustrated.

The SATA SSD 10 may have any kind of form factor, e.g. 2.5 inch, 3.5 inch, mSATA or M2. Basically, it includes a PCB (Printed Circuit Board) 100, 8 flash memory chips (1011 to 1018), a SATA connector 102, A MCU (Micro Control Unit) 103 and a LED (Light Emitting Diode) 104. There might be other components mounted on the PCB 100 but not mentioned. Any one skilled in the art should know the components for operating the SATA SSD 10 smoothly.

In this embodiment, there are 8 flash memory chips. They are used for the purpose of illustration. According to the spirit of the present invention, the number of the flash memory chips is not limited to 8. As along as the flash memory chips can provide a designed storage space for the SATA SSD 10, any number is possible. In practice, the flash memory chips can be further mounted on both sides of the PCB 100. The flash memory chips (1011 to 1018) are used to store data and be accessed. Usually, they are NAND flash memory rather than NOR flash memory. In applications of the present invention, the flash memory chips (1011 to 1018) may all be a single type: SLC, MLC or TLC. It is possible for the flash memory chips (1011 to 1018) to be mixed types, e.g. flash memory chips 1101 to flash memory chips 1105 are MLC type and flash memory chips 1106 to flash memory chips 1108 are TLC type. Memory size of the flash memory chips (1011 to 1018) is not limited by the present invention. It may be 8 Gb, 16 Gb, 32 Gb, 64 Gb or more.

The SATA connector 102 is the interface of the SATA SSD 10 to external environment. That is to say the SATA SSD 10 may utilize the SATA connector 102 to connect to an SATA slot inside a desktop computer. The SATA SSD 10 becomes an internal storage. If the SATA SSD 10 is packaged with a housing, it can become a portable storage. The SATA connector 102 has a number pins for I/O (Inputs/Outputs) and power supply. There is a communicating pin available for staggered spin-up of drives and activity indication. It is the DAS/DSS (Device Activity Signal/Disable Staggered Spin-up) pin (P11) 1022. The key point of the present invention to use the DAS/DSS pin 10222 to control a program in the SATA SSD 10. It will be described in detail later.

Figure 2:
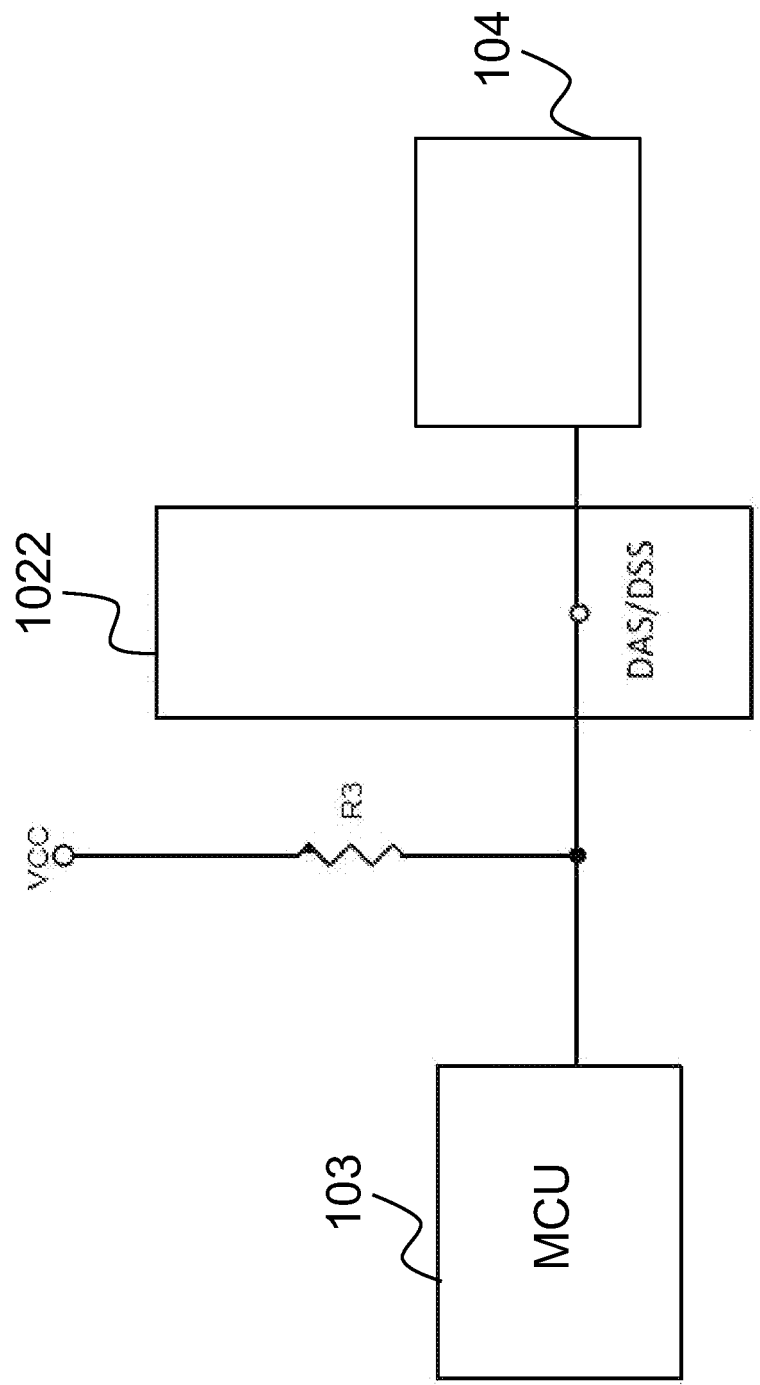
FIG. 2 is a circuit diagram illustrating how to pull electric potential of a DAS/DSS pin to a high level.

The MCU 103 is electrically connected with the flash memory chips (1011 to 1018), the SATA connector 102 and the LED 104. It can operate the SATA SSD 10 and access the flash memory chips (1011 to 1018) to fetch data or write data into. The MCU 103 has a memory unit 1032. The memory unit 1032 may be an EEPROM (Electrically-Erasable Programmable Read-Only Memory). It is used to save firmware for tuning performance of hardware of the SATA SSD 10. A detecting program is written into the memory unit 1032. The detecting program can be initiated by pulling high electric potential of the DAS/DSS pin 1022. In order to have a better understanding of this, please refer to FIG. 2. FIG. 2 is a circuit diagram illustrating how to pull the electric potential of the DAS/DSS pin 1022 to a high level. When the SATA connector 102 is connected with an external SATA slot, some pins may receive controlling signals with a variation of voltage. For the DAS/DSS pin 1022, it will not be triggered if not connected to a corresponding terminal in the SATA slot. After connecting, a node 104 in the SATA slot is connected to the DAS/DSS pin 1022. The DAS/DSS pin 1022 receives a signal to initiate the detecting program. The electron potential of the node 104 is at high level, e.g. 3.3V or other designed voltage. Thus, the electron potential of the DAS/DSS pin 1022 is increased (pulled) from 0V to the high level. Under this situation, the detecting program can automatically run when the SATA connector 102 is connected with the external SATA slot. Increasing of electric potential may be controlled by a host having the node 104. For example, the host can control a timing to pull the electric potential of the DAS/DSS pin 1022 to the high level. Before the time, the node 104 is grounded and no voltage is applied. In this way, the detecting program can be managed when to start.

After the detecting program runs, it can detect problem cells in the flash memory chips (1011 to 1018) of the SATA SSD 10. The problem cells can be classified as aged and dead cells. The aged cells may work normally when the detecting job is going on. However, if working temperature increases, they will lose their ability to distinguish whether their status is 0 or 1. Or, the aged cells may get aged very fast than normal cells. Aged cells are defective area of the flash memory chips when it was manufactured in the fab. It can hardly be avoided, especially when manufacturing processes come to under-20 nm. Due to structure, TLC flash memory chips age or even die faster (times being written) than MLC flash memory chips. MLC flash memory chips get aged fast than SLC flash memory chips. It is very important for TLC flash memory chips and MLC flash memory chips to have aging test in case more quality issues happen in the future. The dead cell is defined as that the cell cannot function when the detecting job processes. There are many methods to find out aged or dead cells in the SATA SSD 10. Any of them can be used. Since it is not a key point of the present invention, the methods are not mentioned here. The program can also run to collect location data of the aged and dead cells in the SATA SSD 10, further store the location data of the aged and dead cells in a storage area in the SATA SSD 10.

Here, the location data maybe physical locations of the aged or dead cells. It may be detecting time or aged or dead status of the cell (the cell is aged or dead when it is detected). Preferably, the location data contain a combination of the information mentioned above. It should be noticed that the location data can be stored in any designed or available storage area in the flash memory chips (1011 to 1018) of the SATA SSD 10 except those cells being detected dead or aged. It is to prevent the location data from losing. In addition, the detecting program can isolate the aged and dead cells so that they are not accessed by the MCU 103. Users won't find defective cells or they won't store their data in cells or pages where the data may soon be lost or incorrect. It should be emphasized that the isolation may be processed on the problem cells or the page containing the problem cells. For the latter, some good cells may be excluded for use.

The location data are not only limited to be stored in the SATA SSD 10. They can be stored or shown externally. The MCU 103 can further output the location data through the DAS/DSS pin 1022 externally (e.g. the host) in a form of electric potential changes. The DAS/DSS pin 1022 becomes a signal source rather than a recipient. An encoding method for presenting the location data by sequential 0 and 1 is necessary. For example, one page located in the first location of the flash memory chip 1011 may be shown by "0-0-0-1-0-0-0-1". The first "0-0-0-1" indicates the flash memory chip 1011 and the second "0-0-0-1" indicates the first location. The MCU 103 can also output the location data through the LED in a sequence of on and off. In practice, the output to the LED can also be directly conducted by the DAS/DSS pin 1022 rather than the MCU 103. The "0-0-0-1-0-0-0-1" would become off-off-off-on and off-off-off-on when each state keeps 0.5 s. The LED signals or the electric potential changes can further include a message of detecting process (i.e. at a detecting stage, a storing stage, an isolating stage or an end stage) to let people know it status.

Figure 3:
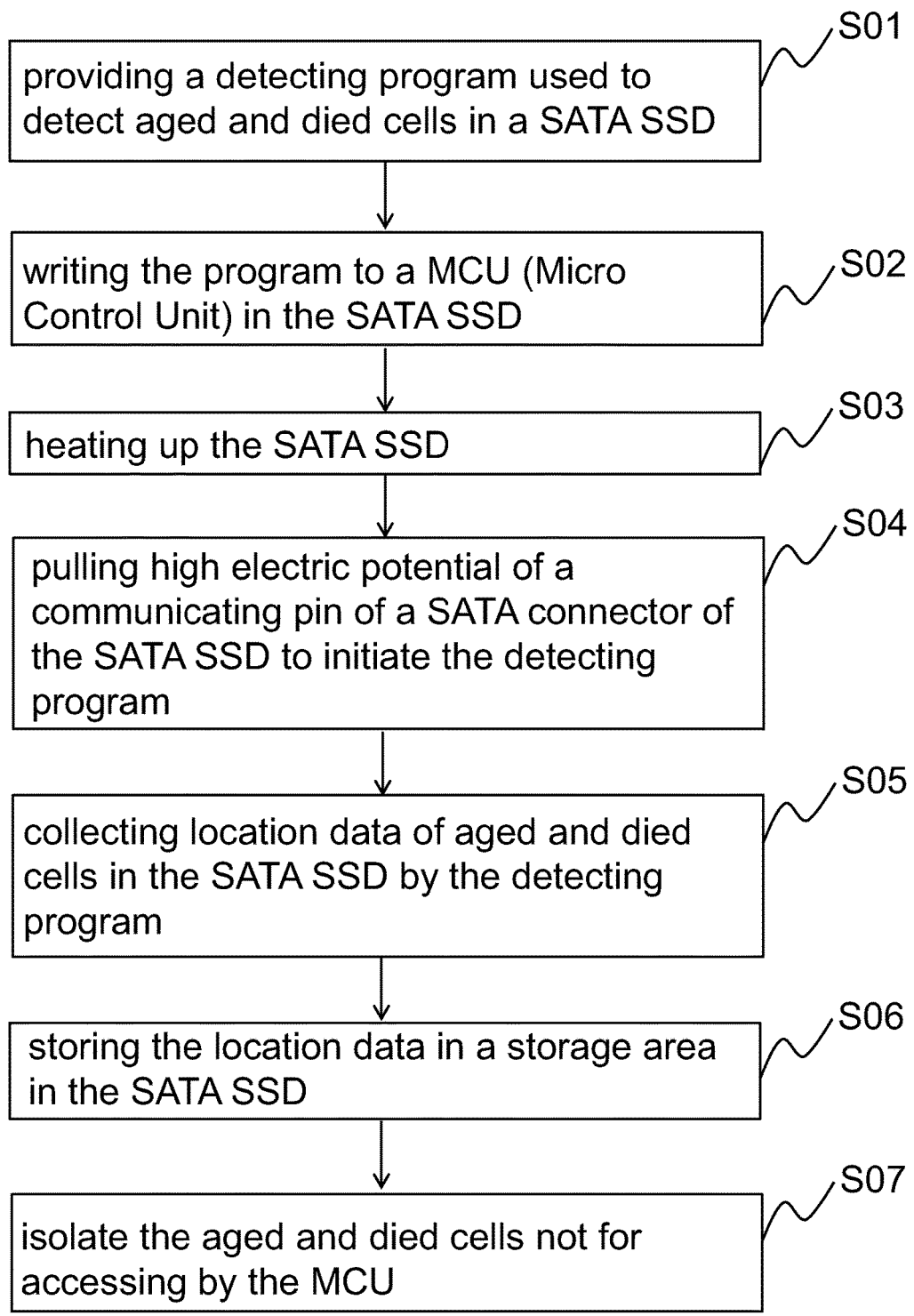
FIG. 3 is a flowchart of the processes of a method according to the present invention.

By utilizing the architecture as the SATA SSD 10 shows, the present invention provides a method for detecting problem cells of a SATA SSD. Please see FIG. 3. It is a flowchart of the processes of the method. First, after the hardware of the SATA SSD 10 is assembled, the detecting program used to detect aged and dead cells in the SATA SSD 10 mentioned above should be provided (S01). Then, write the detecting program to the MCU 103 in the SATA SSD 10 (S02). In order to effectively find out where the aged cells are, a burn-in test may be required before the detecting program starts functioning. It means to heat up the SATA SSD 10 (S03). There are many way to heat up the SATA SSD 10 (usually heating up the temperature around) to simulate a possible working environment or a worse situation that the SATA SSD 10 may encounter. For example, put the SATA SSD 10 on an oven. The time for step S03 may last from tens of minutes to several hours. It depends on how strict the test is. Step S03 is not necessary according to the spirit of the present invention. It exists just to help quality inspection. Afterwards, pull high electric potential of the communicating pin (DAS/DSS pin 1022) of the SATA connector 102 of the SATA SSD 10 to initiate the detecting program (S04). It takes time for the detecting program to find out and collect the location data of aged and dead cells in the SATA SSD (S05). Then, the detecting program stores the location data in a storage area in the SATA SSD 10 (S06). Before the detecting program finishes working, it isolates the aged and dead cells not for accessing by the MCU 103 (S07). Thus, the aged and dead cells can be excluded for use. As mentioned above, the cells that store the location data should not be dead or aged.

After the detecting program finishes working, the present invention further discloses several steps to make the location data can be revealed. An outputting step can follows the step S06 that the MCU 103 outputs the location data through the DAS/DSS pin 1022 in a form of electric potential change externally to other display device. The MCU can also initiates another outputting step following the step S06 to output the location data through the LED 104 of the SATA SSD 10 in a sequence of on and off. Of course, as explained above, the latter outputting step may be processed directly by the detecting program before the detecting program stops functioning.

For the description above, it is obvious that the present invention have several advantages. First, existing interface is utilized. No more testing design is required. It saves cost for SSD manufacturers. Second, the detecting program runs to test the SATA SSD without taking apart any housing for fixture outermost. The detecting program can start functioning even after a burn-in process passed. In practice, wave soldering may replace the burn-in process. Third, the detecting program can be automatically run without being controlled by a computer. It saves time and cost.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for detecting problem cells of a SATA (Serial Advanced Technology Attachment) SSD (Solid State Drive), comprising the steps of:
   providing a detecting program used to detect aged and dead cells in a SATA SSD, wherein the SATA SSD has a plurality of flash memory chips which each has a plurality of memory cells;
   writing the detecting program to a MCU (Micro Control Unit) in the SATA SSD;
   initiating the detecting program by increasing the electric potential of a communicating pin of a SATA connector of the SATA SSD to a higher level while the SATA connector is connected to an external SATA slot;
   collecting location data of aged and dead cells in the SATA SSD by the detecting program;
   storing the location data of the aged and dead cells in a storage area in the SSD, and
   outputting the location data through a LED (Light Emitting Diode) of the SATA SSD in a sequence of on and off, wherein the location data includes a first information and a second information, the first information is an indication of which of the plurality of flash memory chips includes the aged and dead cells, and the second information is an indication of which of the plurality of memory cells are determined as the aged and dead cells.

2. The method according to claim 1, further comprising a step after the storing step:
   isolating the aged and dead cells not for accessing by the MCU.

3. The method according to claim 1, further comprising a step after the writing step:
   heating up the SATA SSD.

4. The method according to claim 1, wherein the communicating pin is DAS/DSS (Device Activity Signal/Disable Staggered Spin-up) pin.

5. The method according to claim 1, wherein the location data comprises physical locations of the aged or dead cells, detecting time, aged or dead status of the cell, or a combination thereof.

6. The method according to claim 1, wherein the cells that store the location data area are not dead or aged.

7. A SATA SSD having a self-detecting function looking for problem cells, comprising:
   a plurality of flash memory chips, for storing data and being accessed, wherein each flash memory chip has a plurality of memory cells;
   a SATA connector, having a communicating pin; and
   a MCU, electrically connected with the flash memory chips and the SATA connector, for operating the SATA SSD and accessing the flash memory chips, having a memory unit; wherein a detecting program is written into the memory unit; the detecting program is initiated by increasing the electric potential of the communicating pin to a higher level while the SATA connector is connected to an external SATA slot; the detecting program runs to detect aged and dead cells in the SATA SSD, collect location data of aged and dead cells in the SATA SSD, and store location data of the aged and dead cells in a storage area in the SATA SSD,
   wherein the MCU outputs the location data through a LED which is electrically connected with the MCU in a sequence of on and off,
   wherein the location data includes a first information and a second information, the first information is an indication of which of the plurality of flash memory chips includes the aged and dead cells, and the second information is an indication of which of the plurality of memory cells are determined as the aged and dead cells.

8. The SATA SSD according to claim 7, wherein the detecting program isolates the aged and dead cells so that they are not accessed by the MCU.

9. The SATA SSD according to claim 7, wherein the communicating pin is DAS/DSS pin.

10. The SATA SSD according to claim 7, wherein the location data comprises physical locations of the aged or dead cells, detecting time, aged or dead status of the cell, or a combination thereof.

11. The SATA SSD according to claim 7, wherein the cells that store the location data are not dead or aged.

* * * * *